United States Patent
Bunce et al.

(10) Patent No.: US 9,583,211 B1
(45) Date of Patent: Feb. 28, 2017

(54) INCORPORATING BIT WRITE CAPABILITY WITH COLUMN INTERLEAVE WRITE ENABLE AND COLUMN REDUNDANCY STEERING

(71) Applicant: INTERNATIONAL BUSINESS MACHINES CORPORATION, Armonk, NY (US)

(72) Inventors: Paul A. Bunce, Poughkeepsie, NY (US); John D. Davis, Wallkill, NY (US); Russell P. Hayes, Poughkeepsie, NY (US); Brian J. Yavoich, Highland, NY (US)

(73) Assignee: INTERNATIONAL BUSINESS MACHINES COPRORATION, Armonk, NY (US)

( * ) Notice: Subject to any disclaimer, the term of this patent is extended or adjusted under 35 U.S.C. 154(b) by 0 days.

(21) Appl. No.: 15/169,933

(22) Filed: Jun. 1, 2016

(51) Int. Cl.
| | | |
|---|---|---|
| *G11C 17/00* | (2006.01) | |
| *G11C 17/18* | (2006.01) | |
| *G11C 29/00* | (2006.01) | |
| *G11C 17/16* | (2006.01) | |
| *G11C 29/02* | (2006.01) | |

(52) U.S. Cl.
CPC .............. *G11C 17/18* (2013.01); *G11C 17/16* (2013.01); *G11C 29/02* (2013.01); *G11C 29/78* (2013.01); *G11C 29/785* (2013.01); *G11C 29/789* (2013.01)

(58) Field of Classification Search
CPC ......... G11C 17/16; G11C 17/18; G11C 29/02; G11C 29/789; G11C 29/785

USPC .................................................. 365/96, 225.7
See application file for complete search history.

(56) References Cited

U.S. PATENT DOCUMENTS

| | | | | |
|---|---|---|---|---|
| 5,257,229 | A * | 10/1993 | McClure .............. | G11C 29/846 326/106 |
| 6,141,268 | A | 10/2000 | Chen et al. | |
| 6,335,897 | B1 | 1/2002 | Yoo | |
| 6,584,023 | B1 | 6/2003 | Bunce et al. | |
| 7,064,990 | B1 | 6/2006 | Dawson et al. | |
| 7,117,400 | B2 | 10/2006 | Batson et al. | |
| 7,177,209 | B2 * | 2/2007 | Choi ........................ | G11C 8/12 365/200 |

(Continued)

FOREIGN PATENT DOCUMENTS

CA 2246763 C 12/2006

*Primary Examiner* — Pho M Luu
(74) *Attorney, Agent, or Firm* — Cantor Colburn LLP; Margaret A. McNamara

(57) ABSTRACT

A column access control circuit for generating column write enable outputs with redundancy steering control and bit write control for an integrated circuit chip, and an integrated circuit chip having the same. A column access control circuit may include: a column write enable driver, a redundancy steering logic, and a bit write controller. The column write enable driver may produce column write enable outputs through an output. The column write enable driver is configured to receive certain column interleave write enable and enable column write according to the column interleave write enable received. The redundancy steering logic is configured to receive one or more fuses and skip a damaged column indicated by a corresponding fuse. The bit write controller is configured to receive one or more bit write and provide bit write control according to the one or more bit write received.

20 Claims, 6 Drawing Sheets

(56) References Cited

U.S. PATENT DOCUMENTS

| | | | |
|---|---|---|---|
| 7,254,069 B2* | 8/2007 | Haraguchi | G11C 29/80 |
| | | | 365/200 |
| 7,738,308 B2* | 6/2010 | Afghahi | G11C 29/789 |
| | | | 365/200 |
| 7,826,285 B2 | 11/2010 | Wissel | |
| 8,427,894 B2 | 4/2013 | Behrends et al. | |
| 9,111,624 B2* | 8/2015 | Fujita | G11C 11/1675 |
| 2008/0273406 A1 | 11/2008 | Behrends et al. | |

* cited by examiner

INCORPORATING BIT WRITE CAPABILITY WITH COLUMN INTERLEAVE WRITE ENABLE AND COLUMN REDUNDANCY STEERING

BACKGROUND

The present disclosure relates generally to integrated circuit chips, and more particularly to chips having column write enable control, redundancy steering control and bit write control.

Conventionally, a memory chip may include column write enable control and redundancy steering control. Under certain circumstances, a memory location needs to be updated or tested only to one or more specific bits instead of a whole word. This is known as bit write.

Therefore, heretofore unaddressed needs still exist in the art to address the aforementioned deficiencies and inadequacies.

SUMMARY

In one aspect, the present disclosure relates to a column access control circuit for an integrated circuit chip. In certain embodiments, the column access control circuit for an integrated circuit chip may include: a column write enable driver, a redundancy steering logic, and a bit write controller. The column write enable driver may include an output to produce column write enable output. The column write enable driver is configured to receive one or more column interleave write enable (CIWE) and enable a column write according to the column interleave write enable received. The redundancy steering logic is configured to receive redundancy status from one or more fuses and skip a damaged column indicated by a corresponding fuse. The bit write controller is configured to receive one or more bit write and provide bit write control according to the one or more bit write received. The column access control circuit incorporates the bit write control into the redundancy steering, and then combines the redundancy steering and column interleave write enable to generate the column write enable output having both redundancy steering control and bit write control.

In certain embodiments, the bit write control is incorporated into redundancy steering control through the redundancy steering logic and the bit write controller. The one or more fuses implement both bit write control and redundancy steering control through the redundancy steering logic and the bit write controller. The column write enable driver acts as a column interleave write enable selector and a bit write suppressor.

In another aspect, the present disclosure relates to a memory chip. In certain embodiments, the memory chip may include a certain number of memory columns. Each memory column may include a column access control circuit. Each column access control circuit may include a column write enable driver, redundancy steering logic, and a bit write controller. The column write enable driver may include an output to produce column write enable output. The column write enable driver may be configured to receive one or more column interleave write enable and enable column write according to the column interleave write enable received. The redundancy steering logic may be configured to receive one or more fuses and skip a damaged column marked by a corresponding fuse. The bit write controller may be configured to receive one or more bit write and provide bit write control according to the one or more bit write received. The column access control circuit incorporates redundancy steering control and bit write control into the column write enable output.

In yet another aspect, the present disclosure relates to a method for implementing column write enable with redundancy steering and bit write on an integrated circuit chip. In certain embodiments, the integrated circuit chip may include certain memory columns and each of the memory columns may include a column access control circuit. Each of the column access control circuits may include a column write enable driver, redundancy steering logic, and a bit write controller. The method may include: receiving a series of column interleave write enable at the column write enable drivers, receiving the redundancy status from one or more fuses at the redundancy steering logic, and a series of bit write at the bit write controllers, processing the series of bit write received at each of the bit write controllers to implement a bit write control for each of the memory columns, incorporating the bit write control with redundancy steering control through the redundancy steering logic and each of the bit write controllers to generate redundancy steering control having bit write capability for each of the memory columns, processing the redundancy steering control generated and the series of column interleave write enable received at each of the column write enable drivers to incorporate the bit write control and the redundancy steering control with column write enable control for each of the memory columns, and generating column write enable outputs through each of the column write enable drivers for each of the memory columns. The column write enable outputs incorporate a column write enable control, a redundancy steering control and a bit write control.

These and other aspects of the present disclosure will become apparent from the following description of the preferred embodiment taken in conjunction with the following drawings and their captions, although variations and modifications therein may be affected without departing from the spirit and scope of the novel concepts of the present disclosure.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

Figure 1A:
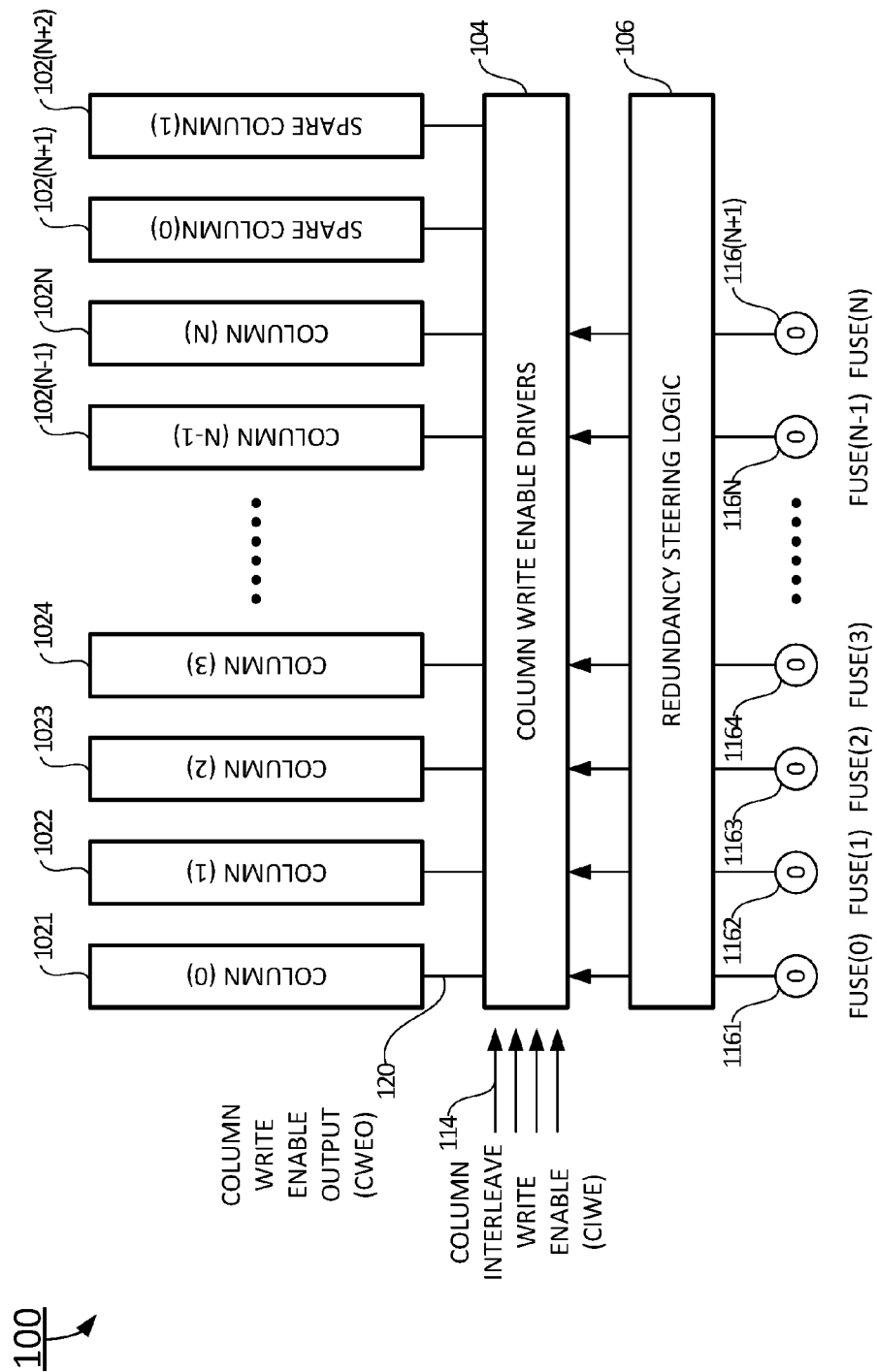
FIG. 1A is a block diagram showing a chip having column write and redundancy steering logic without a damaged column.

The present disclosure is more particularly described in the following examples that are intended as illustrative only because numerous modifications and variations therein will be apparent to those skilled in the art. Various embodiments of the invention are now described in detail. Referring to the drawings, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present disclosure. Additionally, some terms used in this specification are more specifically defined below.

The terms used in this specification generally have their ordinary meanings in the art, within the context of the present disclosure, and in the specific context where each term is used. Certain terms that are used to describe the present disclosure are discussed below, or elsewhere in the specification, to provide additional guidance to the practitioner regarding the description of the present disclosure. It will be appreciated that same thing can be said in more than one way. Consequently, alternative language and synonyms may be used for any one or more of the terms discussed herein, nor is any special significance to be placed upon whether or not a term is elaborated or discussed herein. The use of examples anywhere in this specification including examples of any terms discussed herein is illustrative only, and in no way limits the scope and meaning of the present disclosure or of any exemplified term. Likewise, the present disclosure is not limited to various embodiments given in this specification.

Unless otherwise defined, all technical and scientific terms used herein have the same meaning as commonly understood by one of ordinary skill in the art to which this invention pertains. In the case of conflict, the present document, including definitions will control.

As used herein, "plurality" means two or more. The terms "comprising," "including," "carrying," "having," "containing," "involving," and the like are to be understood to be open-ended, i.e., to mean including but not limited to.

The present disclosure will now be described more fully hereinafter with reference to the accompanying drawings FIGS. 1-5, in which certain exemplary embodiments of the present disclosure are shown. The present disclosure may, however, be embodied in many different forms and should not be construed as limited to the embodiments set forth herein; rather, these embodiments are provided so that this invention will be thorough and complete, and will fully convey the scope of the invention to those skilled in the art.

Figure 1B:
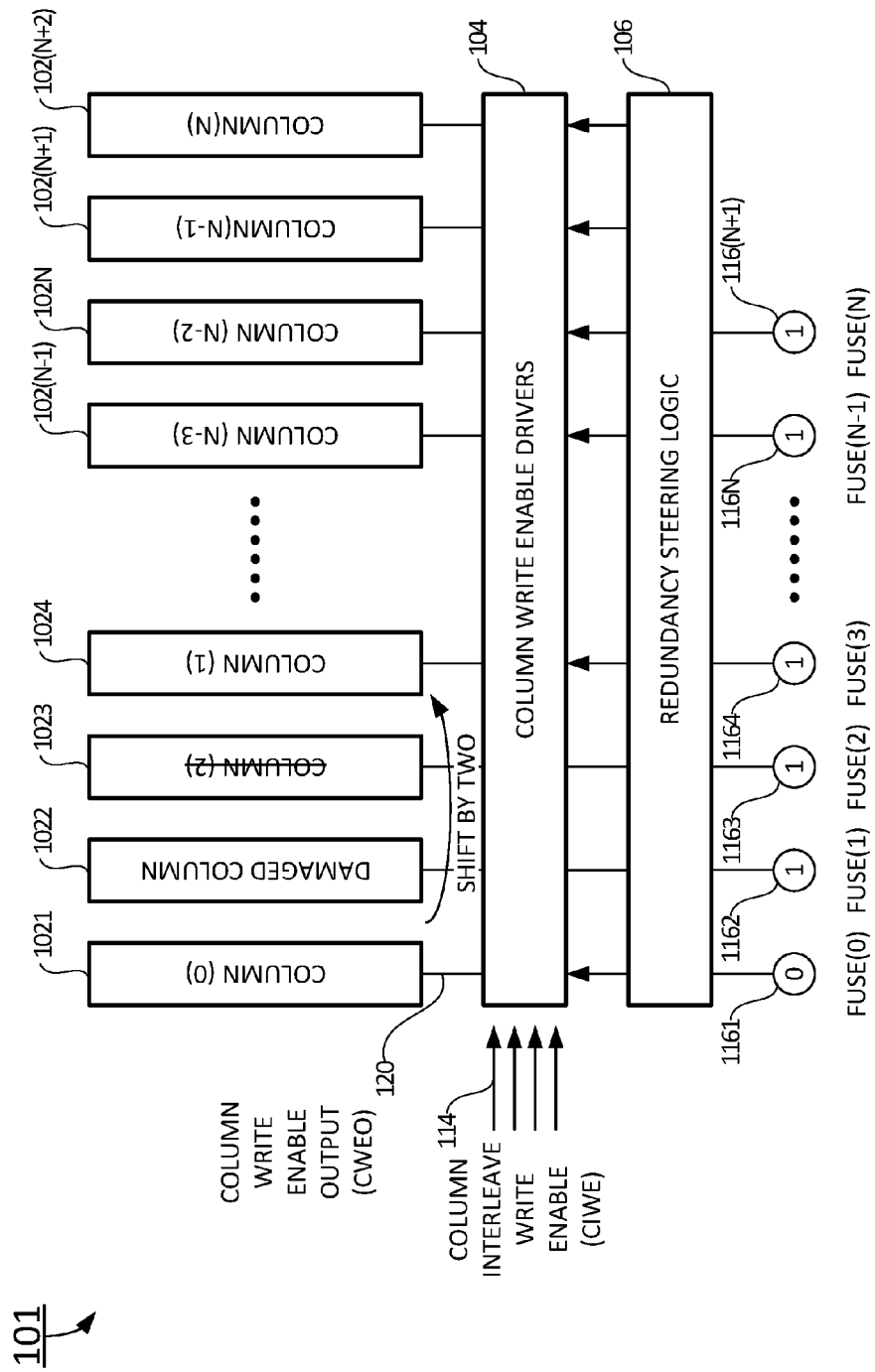
FIG. 1B is a block diagram showing a chip having column write and redundancy steering logic with a damaged column, according to certain embodiments of the present disclosure.

In one aspect, the present disclosure relates to a memory 100 having redundancy steering control and column write control as shown in FIG. 1A and FIG. 1B according to certain embodiments of the present disclosure. In one embodiment, a memory 100 may include certain columns of memory 102, column write enable drivers 104, and a redundancy steering logic 106, as shown in FIG. 1A. In another embodiment, a memory 101 may also include certain columns of memory 102, column write enable drivers 104, and a redundancy steering logic 106. In certain embodiments, the memory 100 may include N+2 columns: column 1021, column 1022, . . . , and column 102N, and a first spare column 102(N+1), and a second spare column 102(N+2), where N is a positive integer. Columns 1021, through 102(N+2) are enabled for writing by column write enable drivers 104, which select from column interleave write enable based on redundancy steering. The first spare column 102(N+1) and the second spare column 102(N+2) are built in for replacing at least one defective or damaged column. The column write enable drivers 104 may receive column interleave write enable 114 from a memory controller (not shown in FIG. 1A) to enable or disable each and every column. The redundancy steering logic 106 is used to access a fuse 116 to find out if there is a defective column on the memory 100. In certain embodiments, the fuse 116 has N bits, each bit corresponds to one column N on the memory 100. In one embodiment, the fuse 116 may be implemented by an N bit long register. Prior to a test performed on the memory 100, the fuse 116 is initialized as all zero on each of the bit of the N bit long register indicating all columns are non-defective.

In certain embodiments, during a memory 100 test, the memory 100 is carefully tested for any manufacturing defects. When a column 1021 is found defective, then a corresponding fuse 116$i$ is set to be 1, i>=I, as shown in FIG. 1B. In this case, the second column 1022 is determined to be defective, the defective column 1022 and an immediate column 1023 are skipped and the next non-defective column is column 1024. The fuse 1162 is set to 1, and all the remaining fuse 1163 through 116(N+1) are all set to 1 indicating the column 1022 is a defective column and the column 1023 is skipped, as shown in FIG. 1B. In this case, the fuse 116 may steer the column interleave write enable 114 over by two columns, skipping the defective column 1022 and the next column 1023. The first spare column 102(N+1) and the second spare column 102(N+2) become column N−1 and column N, respectively.

Figure 2:
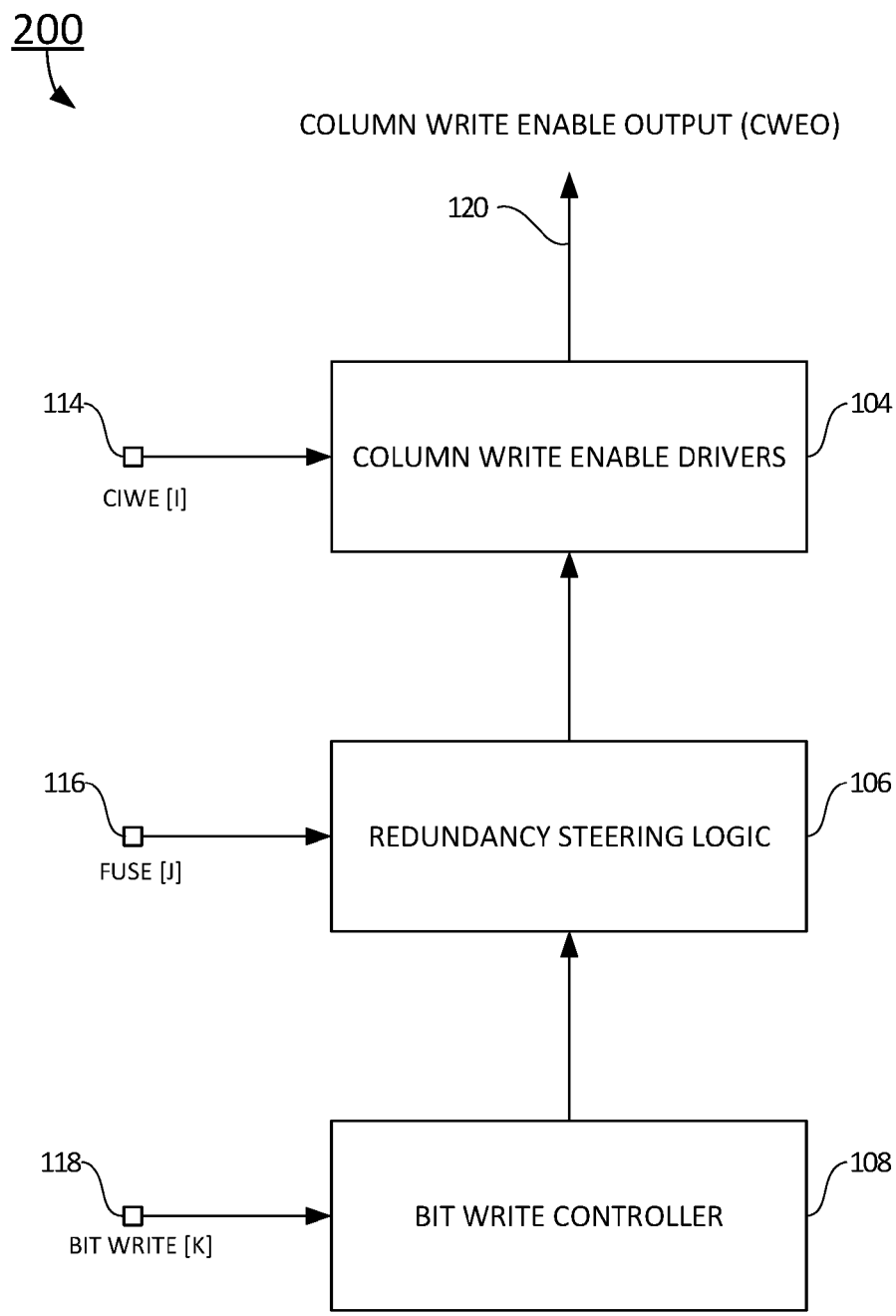
FIG. 2 is a block diagram of a memory access control circuit enabling column write with column redundancy steering control and bit write control according to certain embodiments of the present disclosure.

In one aspect, the present disclosure relates to chips capable of column write enabling, column redundancy steering and bit write. In certain embodiments, as shown in FIG. 2, a memory access control circuit 200 having column write enable control and redundancy steering control is shown. The memory access control circuit 200 may be required to incorporate a bit write control in addition to the column write enable and redundancy steering control. In certain embodiments, the memory access control circuit 200 may include a column write enable driver 104, a redundancy steering logic 106, and a bit write controller 108. The column write enable driver 104 may receive one or more column interleave write enable 114 and the column write enable driver 104 may be configured to enable column write through one or more column write enable outputs 120 according to the one or more column interleave write enable 114 received. The redundancy steering logic 106 may receive redundancy status from one or more fuses 116 and the redundancy steering logic 106 may be configured to perform redundancy steering according to the one or more fuses 116 received. The bit write controller 108 may receive one or more bit write 118 and the bit write controller 108 is configured to perform bit write according to the one or more bit write 118 received.

Figure 3:
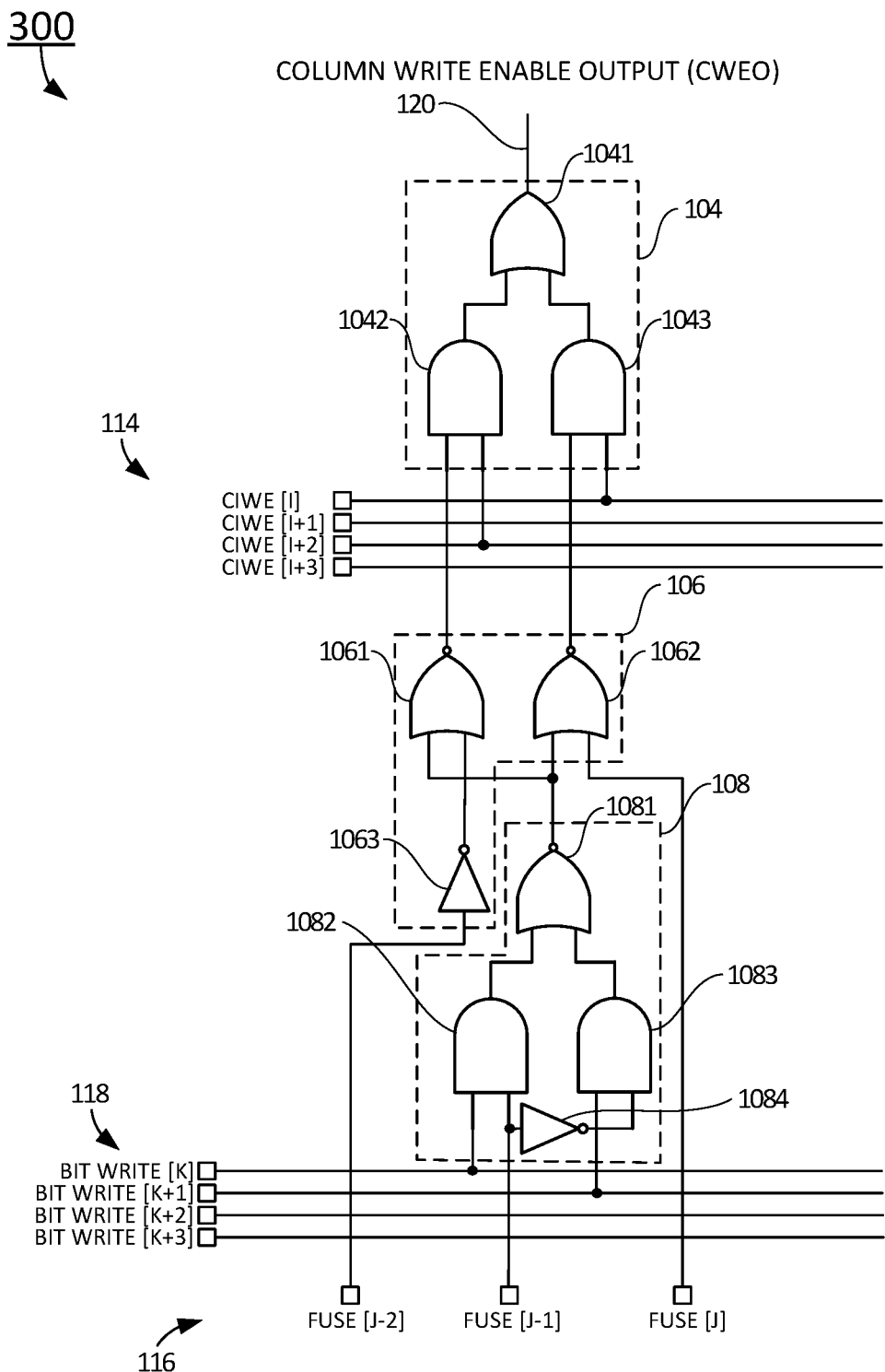
FIG. 3 is a circuit diagram of the memory access control circuit enabling column write with column redundancy steering control and bit write control according to certain embodiments of the present disclosure.

Referring now to FIG. 3, a circuit diagram of a memory access control circuit 300 enabling column write with column redundancy steering control and bit write control is shown according to one embodiment of the present disclosure. The memory access control circuit 300 may include the column write enable driver 104, the redundancy steering logic 106, and the bit write controller 108.

In certain embodiments, the column write enable driver 104 may be configured to enable column write through one or more column write enable outputs 120 according to one or more column interleave write enable 114 received. The column write enable driver 104 may include a first AND gate 1042, a second AND gate 1043 to receive the column interleave write enable 114, and an OR gate 1041. The first AND gate 1042 may include a first input terminal electrically coupled to a first output of redundancy steering logic 106, a second input terminal electrically coupled to a third CIWE [I+2] of the column interleave write enable 114 and an output terminal configured to provide an output of the first AND gate 1042. The second AND gate 1043 may include a first input terminal electrically coupled to a second output of redundancy steering logic 106, a second input terminal electrically coupled to a first CIWE [I] of the column interleave write enable 114, and an output terminal configured to provide an output of the second AND gate 1043. The OR gate 1041 may include a first input terminal electrically coupled to the output terminal of the first AND gate 1042, a second input terminal electrically coupled to the output terminal of the second AND gate 1043, and an output terminal configured to provide a column write enable output 120 of the column write enable driver 104.

In certain embodiments, when the output terminal of the first NOR gate 1061 of the redundancy steering logic 106 is 0, the column interleave write enable CIWE [I+2] is suppressed. When the output terminal of the second NOR gate 1062 of the redundancy steering logic 106 is 0, the column interleave write enable CIWE[I] is suppressed.

When the output terminal of the first NOR gate 1061 of the redundancy steering logic 106 is 1, the column interleave write enable CIWE[I+2] is enabled. When the output terminal of the second NOR gate 1062 of the redundancy steering logic 106 is 1, the column interleave write enable CIWE[I] is enabled.

In certain embodiments, the redundancy steering logic 106 may receive redundancy status from one or more fuses 116 and may be configured to perform redundancy steering according to the one or more fuses 116 received. The redundancy steering logic 106 may include a first NOR gate 1061, a second NOR gate 1062, and an inverter 1063. The first NOR gate 1061 may include a first input terminal electrically coupled to an output of the bit write controller 108, a second input terminal electrically coupled to an output terminal of the inverter 1063, and an output terminal configured to provide an output to the first input terminal of the first AND gate 1042 of the column write enable driver 104. The second NOR gate 1062 may include a first input terminal electrically coupled to the output of the bit write controller 108, a second input terminal electrically coupled to an output terminal of the current column FUSE[J] of the fuse 116, and an output terminal configured to provide an output to the first input terminal of the second AND gate 1043 of the column write enable driver 104. The inverter 1063 may include an input terminal electrically coupled to a fuse for two columns before the current column: FUSE [J−2] of the fuse 116.

In certain embodiments, when the fuse of the current column FUSE[J] is set to 0, the current column FUSE[J] is a functional column. Any fuses before the current column FUSE[J] must be 0. In this case, the output of the inverter 1063 will be 1, and the output of the first NOR gate 1061 of the redundancy steering logic 106 will be 0, suppressing the output of the first NOR gate 1061, which suppresses the column interleave write enable CIWE[I+2] connected to the first AND gate 1042 of the column enable driver 104, and the output of the bit write controller 108 will be inverted through the second NOR gate 1062.

When the fuse for the current column FUSE[J] is set to 1, the current column FUSE[J] is a damaged column, and this column and the next column should be skipped to replace the damaged column. Since the current column FUSE[J] is set to 1, the output of the second NOR gate 1062 of the redundancy steering logic 106 will be 0, suppressing the output of the second NOR gate 1062, which suppresses the column interleave write enable CIWE[I] connected to the second AND gate 1043 of the column enable driver 104.

In certain embodiments, the bit write controller 108 may receive one or more bit write 118 and the bit write controller 108 is configured to perform bit write according to the one or more bit write 118 received. The bit write controller 108 may include a first AND gate 1082, a second AND gate 1083, an NOR gate 1081 and an inverter 1084. The first AND gate 1082 may include a first input terminal electrically coupled to a first bit write BIT WRITE [K], and a second input terminal electrically coupled to the fuse of the previous column FUSE[J−1], and an output terminal electrically coupled to a first input terminal of the NOR gate 1081. The second AND gate 1083 may include a first input terminal electrically coupled to a second bit write BIT WRITE [K+1], and a second input terminal electrically coupled to the previous fuse FUSE[J−1] through the inverter 1084, and an output terminal electrically coupled to a second input terminal of the NOR gate 1081.

In certain embodiments, when the fuse of the current column FUSE[J] is set to 0, the current column FUSE[J] is a functional column. Any fuses before the current column FUSE[J] must be 0. In this case, the output of the inverter 1063 will be 1, and the output of the first NOR gate 1061 of the redundancy steering logic 106 will be 0, suppressing the output of the first NOR gate 1061, which suppresses the column interleave write enable CIWE[I+2] connected to the first AND gate 1042 of the column enable driver 104, and the output of the bit write controller 108 will be inverted through the second NOR gate 1062. When the fuse for the current column FUSE[J] is set to 1, the current column FUSE[J] is a damaged column, and this column and the next column should be skipped to replace the damaged column. When FUSE[J−1], the column before the current column, is set to 0, the output of the inverter 1084 is 1. In this case, when a BIT WRITE[K+1] is 1, the output terminal of the second AND gate 1083 is 1, then the output of the NOR gate 1081 will be 0. When FUSE[J−2] is set to 0, the output of the inverter 1063 is 1, suppressing the output of the first NOR gate 1061, which suppresses the column interleave write enable CIWE[I+2] connected to the first AND gate 1042 of the column enable driver 104. When the next column FUSE[J+1] is set to 0, all columns up to the next column are functional columns. In this case, the output terminal of the first AND gate 1082 will be 0. When the BIT WRITE[K+1] is 0, then the output of the second AND gate 1083 will be 0, and when the BIT WRITE[K+1] is 1, then the output of the second AND gate 1083 will be 1. The output terminal of the NOR gate 1081 will be 0, and the output terminal of the second NOR gate 1062 of the redundancy steering logic 106 will be 1, enabling the column interleave write enable CIWE[I] connected to the second AND gate 1043 of the column enable driver 104.

Figure 4:
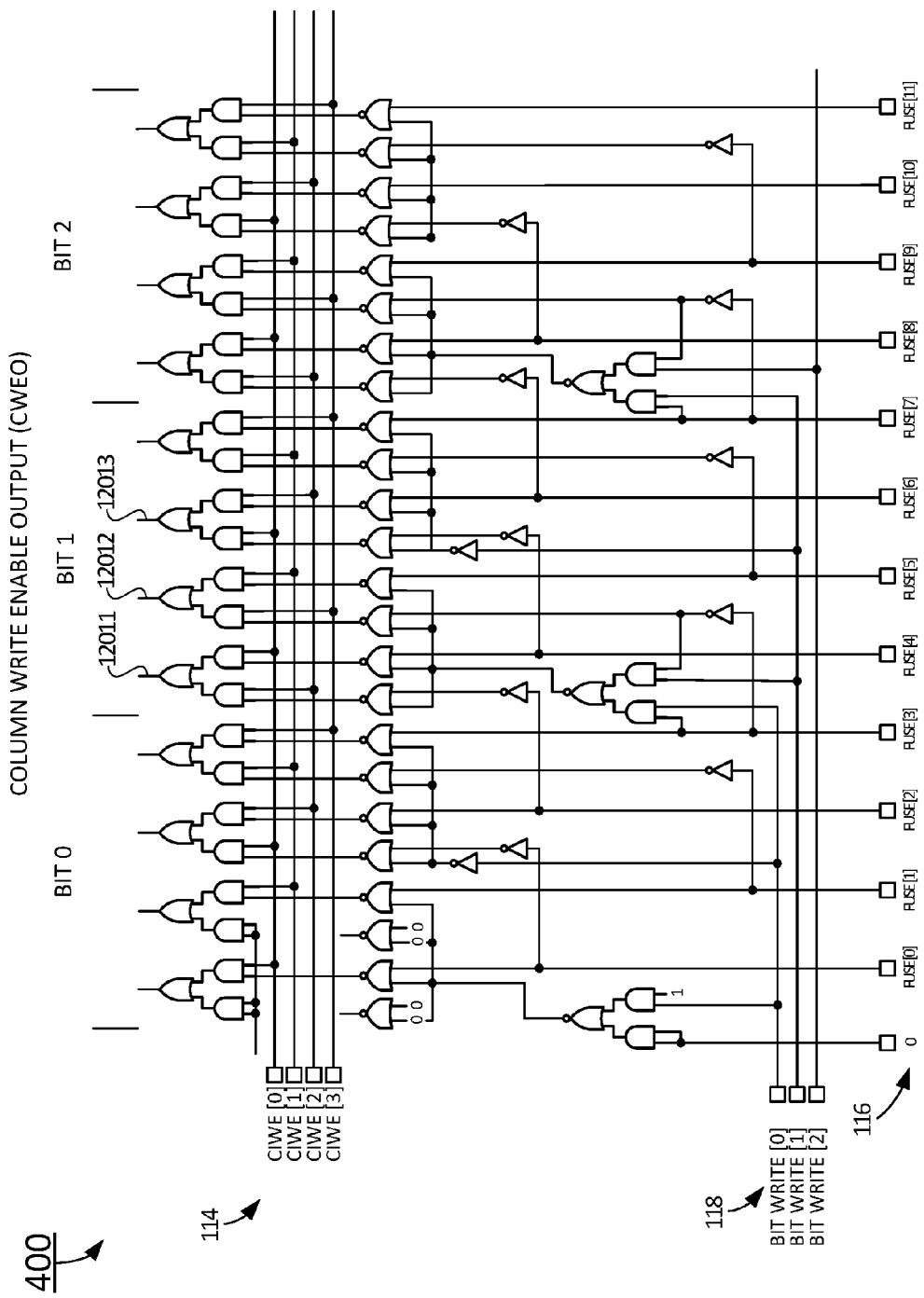
FIG. 4 is a portion of a circuit diagram showing a chip enabling column write with column redundancy steering control and bit write control according to certain embodiments of the present disclosure.

Referring now to FIG. 4, a portion of a circuit diagram of a memory chip 400 enabling column write with column redundancy steering control and bit write control is shown according to certain embodiments of the present disclosure. The memory chip 400 may include certain columns of column write output for certain bits, such as BIT0, BIT1, and BIT2 as shown in FIG. 4, and each one of the BIT0, BIT1, and BIT2 has four columns. Each column may include a corresponding column write enable driver 104, a corresponding redundancy steering logic 106, and a corresponding bit write controller 108 as described through FIG. 2 and FIG. 3.

In certain embodiments, each of the column write enable drivers 104 may be configured to enable column write through one or more column write enable outputs 120 according to one or more column interleave write enable 114 received. Each of the redundancy steering logics 106 may receive redundancy status from one or more fuses 116 and may be configured to perform redundancy steering according to the one or more fuses 116 received. Each of the bit write controller 108 may receive one or more bit write 118 and the bit write controller 108 is configured to perform bit write according to the one or more bit write 118 received. The circuit diagram of the memory chip 400 shows each column FUSE[J] is related to the column FUSE[J+2], which is the column after the next column FUSE[J+1]. When the current column FUSE[J] is a functional column, the column write enable output depends on the bit write 118 of the current column and the column interleave write enable 114 of the current column. When the current column FUSE[J] is a damaged column, the column write enable output 120 must be realigned. For example, as shown in FIG. 4, a fifth fuse FUSE[4] is set as 1, which means the fifth column (or the first column of the BIT 1) is a damaged column. Any column write enable outputs after this column must be shifted by two columns. As shown in FIG. 4, when the fifth column is a damaged column, a column write enable output 12011 for the damaged column and a column write enable output 12012 are invalid column write enable output. Correct column write enable output for the damaged column will be shifted by two columns. In this case, the correct column write enable output for the damaged column should be a column write enable output 12013 as shown in FIG. 4. This column write enable output 12013 incorporates the column redundancy steering input, the column interleave write enable, and the bit write.

Figure 5:
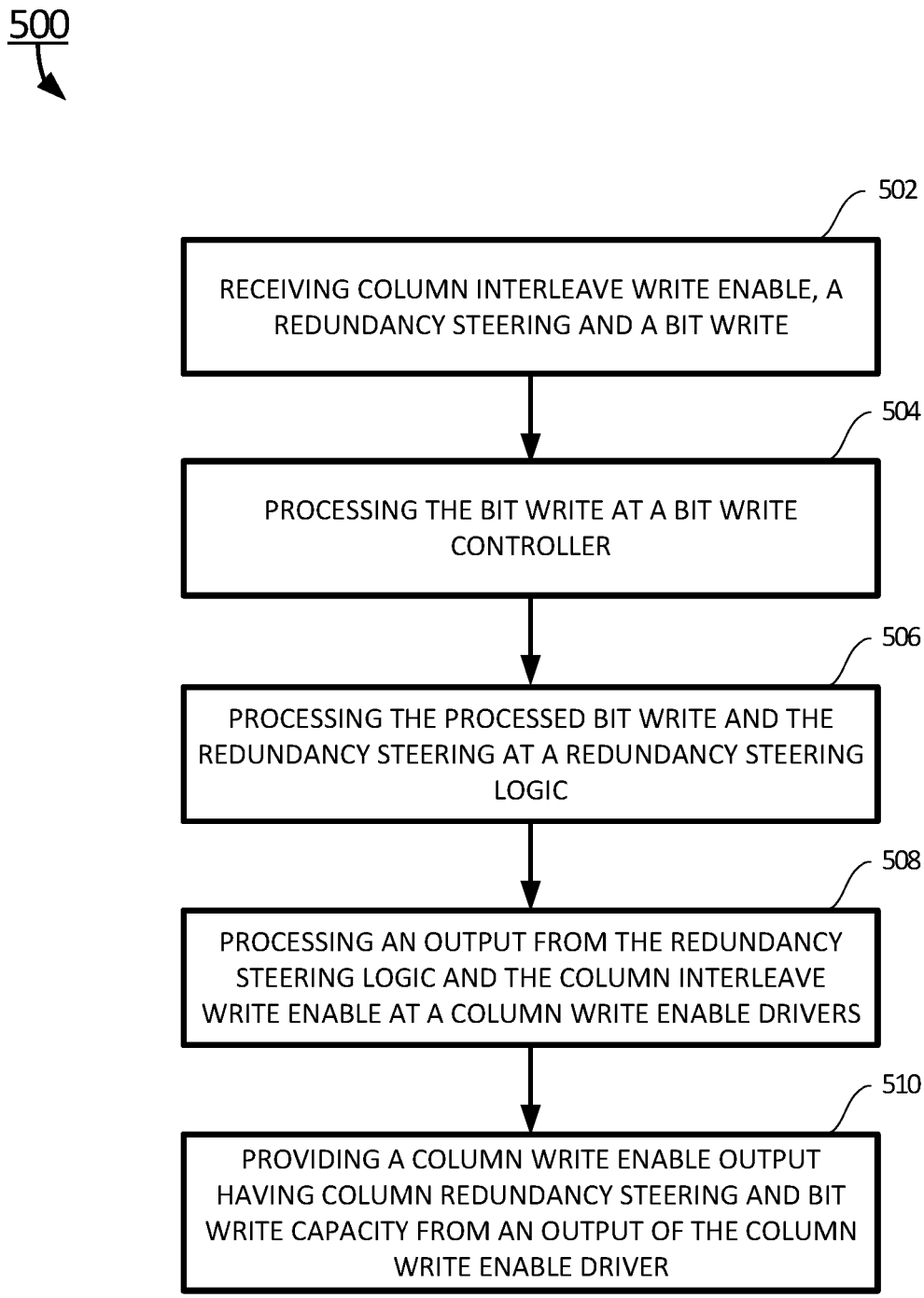
FIG. 5 shows a flow chart of a method of performing column write with column redundancy steering control and bit write control according to certain embodiments of the present disclosure.

In another aspect, the present disclosure relates to a method of performing column write with redundancy steering control and bit write control. Referring now to FIG. 5, a flow chart of a method 500 performing column write with column redundancy steering control and bit write control is shown according to certain embodiments of the present disclosure.

At block 502, the method 500 may include receiving a series of column interleave write enable 114 at one or more column write enable drivers 104, a set of redundancy steering from one or more fuses 116, and a series of bit write 118 at one or more bit write controllers 108. Each of the column write enable drivers 104 may be configured to enable column write through one or more column write enable outputs 120 according to one or more column interleave write enable 114 received. Each of the redundancy steering logics 106 may be configured to perform redundancy steering according to the one or more fuses 116 received. Each of the bit write controller 108 may receive one or more bit write 118 and the bit write controller 108 is configured to perform bit write according to the one or more bit write 118 received.

In certain embodiments, each of the column write enable drivers 104 may include a first AND gate 1042, a second AND gate 1043 to receive the column interleave write enable 114, and an OR gate 1041 as shown in FIG. 3. The first AND gate 1042 may include a first input terminal electrically coupled to a first output of redundancy steering logic 106, a second input terminal electrically coupled to a third CIWE [I+2] of the column interleave write enable 114 and an output terminal configured to provide an output of the first AND gate 1042. The second AND gate 1043 may include a first input terminal electrically coupled to a second output of redundancy steering logic 106, a second input terminal electrically coupled to a first CIWE [I] of the column interleave write enable 114, and an output terminal configured to provide an output of the second AND gate 1043. The OR gate 1041 may include a first input terminal electrically coupled to the output terminal of the first AND gate 1042, a second input terminal electrically coupled to the output terminal of the second AND gate 1043, and an output terminal configured to provide a column write enable output 120 of the column write enable driver 104.

In certain embodiments, each of the redundancy steering logic 106 may include a first NOR gate 1061, a second NOR gate 1062, and an inverter 1063. The first NOR gate 1061 may include a first input terminal electrically coupled to an output of the bit write controller 108, a second input terminal electrically coupled to an output terminal of the inverter 1063, and an output terminal configured to provide an output to the first input terminal of the first AND gate 1042 of the column write enable driver 104. The second NOR gate 1062 may include a first input terminal electrically coupled to the output of the bit write controller 108, a second input terminal electrically coupled to an output terminal of the current column FUSE[J] of the fuse 116, and an output terminal configured to provide an output to the first input terminal of the second AND gate 1043 of the column write enable driver 104. The inverter 1063 may include an input terminal electrically coupled to a fuse for two columns before the current column: FUSE[J−2] of the fuse 116.

In certain embodiments, each of the bit write controller 108 may receive one or more bit write 118 and the bit write controller 108 is configured to perform bit write according to the one or more bit write 118 received. The bit write controller 108 may include a first AND gate 1082, a second AND gate 1083, an NOR gate 1081 and an inverter 1084. The first AND gate 1082 may include a first input terminal electrically coupled to a first bit write BIT WRITE [K], and a second input terminal electrically coupled to the fuse of the previous column FUSE[J−1], and an output terminal electrically coupled to a first input terminal of the NOR gate 1081. The second AND gate 1083 may include a first input terminal electrically coupled to a second bit write BIT WRITE [K+1], and a second input terminal electrically coupled to the previous fuse FUSE[J−1] through the inverter 1084, and an output terminal electrically coupled to a second input terminal of the NOR gate 1081.

At block 504, the method 500 may process the bit write 118 at each of the bit write controllers 108.

In certain embodiments, when the fuse of the current column FUSE[J] is set to 0, the current column FUSE[J] is a functional column. Any fuses before the current column FUSE[J] must be 0. In this case, the output of the inverter 1063 will be 1, and the output of the first NOR gate 1061 of the redundancy steering logic 106 will be 0, suppressing the output of the first NOR gate 1061, which suppresses the column interleave write enable CIWE[I+2] connected to the first AND gate 1042 of the column enable driver 104, and the output of the bit write controller 108 will be inverted through the second NOR gate 1062.

When the fuse for the current column FUSE[J] is set to 1, the current column FUSE[J] is a damaged column, and this column and the next column should be skipped to replace the damaged column. When FUSE[J−1], the column before the current column, is set to 0, the output of the inverter 1084 is 1. In this case, when a BIT WRITE[K+1] is 1, the output terminal of the second AND gate 1083 is 1, then the output of the NOR gate 1081 will be 0. When FUSE[J−2] is set to 0, the output of the inverter 1063 is 1, suppressing the output of the first NOR gate 1061, which suppresses the column interleave write enable CIWE[I+2] connected to the first AND gate 1042 of the column enable driver 104. When the next column FUSE[J+1] is set to 0, all columns up to the next column are functional columns. In this case, the output terminal of the first AND gate 1082 will be 0. When the BIT WRITE[K+1] is 0, then the output of the second AND gate 1083 will be 0, and when the BIT WRITE[K+1] is 1, then the output of the second AND gate 1083 will be 1. The output terminal of the NOR gate 1081 will be 0, and the output terminal of the second NOR gate 1062 of the redundancy steering logic 106 will be 1, enabling the column interleave write enable CIWE[I] connected to the second AND gate 1043 of the column enable driver 104.

At block 506, the method 500 may process the bit write 118 processed in block 504 and the fuse 116 at each of the redundancy steering logics 106.

In certain embodiments, when the fuse of the current column FUSE[J] is set to 0, the current column FUSE[J] is a functional column. Any fuses before the current column FUSE[J] must be 0. In this case, the output of the inverter 1063 will be 1, and the output of the first NOR gate 1061 of the redundancy steering logic 106 will be 0, suppressing the output of the first NOR gate 1061, which suppresses the column interleave write enable CIWE[I+2] connected to the first AND gate 1042 of the column enable driver 104, and the output of the bit write controller 108 will be inverted through the second NOR gate 1062.

When the fuse for the current column FUSE[J] is set to 1, the current column FUSE[J] is a damaged column, and this column and the next column should be skipped to replace the damaged column. Since the current column FUSE[J] is set to 1, the output of the second NOR gate 1062 of the redundancy steering logic 106 will be 0, suppressing the output of the second NOR gate 1062, which suppresses the column interleave write enable CIWE[I] connected to the second AND gate 1043 of the column enable driver 104.

At block 508, the method 500 may process an output from the redundancy steering logic 106 and column interleave write enable 114 at each of the column write enable drivers 104.

In certain embodiments, when the output terminal of the first NOR gate 1061 of the redundancy steering logic 106 is 0, the column interleave write enable CIWE[I+2] is suppressed. When the output terminal of the second NOR gate 1062 of the redundancy steering logic 106 is 0, the column interleave write enable CIWE[I] is suppressed.

When the output terminal of the first NOR gate 1061 of the redundancy steering logic 106 is 1, the column interleave write enable CIWE[I+2] is enabled. When the output terminal of the second NOR gate 1062 of the redundancy steering logic 106 is 1, the column interleave write enable CIWE[I] is enabled.

At block 510, the method 500 may produce a column write enable output 120 through the output terminal of the OR gate 1041 of the column write enable driver 104. The column write enable output 120 may produce enabled column write with the column redundancy steering control and the bit write control. The column write enable output with the column redundancy steering control and the bit write control is produced according to the column interleave write enable 114, the redundancy steering fuses 116 and the bit write 118.

Aspects of the present disclosure are described herein with reference to flowchart illustrations and/or block diagrams of methods. It will be understood that each block of the flowchart illustrations and/or block diagrams, and combinations of blocks in the flowchart illustrations and/or block diagrams, can be implemented by computer readable program instructions or hardware.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A column access control circuit comprising:
a column write enable driver having an output configured to produce column write enable output, wherein the column write enable driver is configured to receive one or more column interleave write enable and enable column write according to the column interleave write enable received;
a redundancy steering logic configured to receive one or more fuses and skip a damaged column indicated by a corresponding fuse; and
a bit write controller configured to receive one or more bit write and provide bit write control according to the one or more bit write received,
wherein the column access control circuit incorporates redundancy steering control and bit write control into the column write enable output.

2. The column access control circuit of claim 1, wherein the bit write control is incorporated into redundancy steering control through the redundancy steering logic and the bit write controller.

3. The column access control circuit of claim 1, wherein the one or more fuses implement redundancy steering control through the redundancy steering logic and the redundancy steering logic incorporates bit write capability into the redundancy steering through the bit write controller.

4. The column access control circuit of claim 1, wherein the column write enable driver acts as a column interleave write enable selector and a bit write suppressor.

5. The column access control circuit of claim 1, wherein the column write enable driver comprises:
   a first AND gate having a first input terminal, a second input terminal electrically coupled to a first column interleave write enable, and an output terminal configured to provide an output of the first AND gate;
   a second AND gate having a first input terminal, a second input terminal electrically coupled to a second column interleave write enable, and an output terminal configured to provide an output of the second AND gate; and
   an OR gate having a first input terminal electrically coupled to the output terminal of the first AND gate, a second input terminal electrically coupled to the output terminal of the second AND gate, and an output terminal configured to provide a column write enable output of the column write enable driver.

6. The column access control circuit of claim 5, wherein the redundancy steering logic comprises:
   an inverter having an input terminal electrically coupled to a fuse of a column which is two columns before a current column, and an output terminal;
   a first NOR gate having a first input terminal, a second input terminal electrically coupled to the output terminal of the inverter, and an output terminal configured to provide a first output to the first input terminal of the first AND gate of the column write enable driver; and
   a second NOR gate having a first input terminal, a second input terminal electrically coupled to a fuse of the current column, and an output terminal configured to provide a second output to the first input terminal of the second AND gate of the column write enable driver.

7. The column access control circuit of claim 6, wherein the bit write controller comprises:
   an inverter having an input terminal electrically coupled to a fuse for a column which is one column before the current column, and an output terminal;
   a first AND gate having a first input terminal electrically coupled to a first bit write, a second input terminal electrically coupled to the fuse of the column which is one column before the current column and the input terminal of the inverter, and an output terminal;
   a second AND gate having a first input terminal electrically coupled to a second bit write, a second input terminal electrically coupled to the output terminal of the inverter, and an output terminal; and
   a NOR gate having a first input terminal electrically coupled to the output terminal of the first AND gate, a second input terminal electrically coupled to the output terminal of the second AND gate, and an output terminal electrically coupled to the first input terminal of the first NOR gate of the redundancy steering logic and the first input terminal of the second NOR gate of the redundancy steering logic.

8. A memory chip comprising:
   a plurality of memory columns, wherein each of the plurality of memory columns comprises a column access control circuit, and each of the column access control circuit comprises:
      a column write enable driver having an output to produce column write enable output, wherein the column write enable driver is configured to receive one or more column interleave write enable and enable column write according to the column interleave write enable received;
      a redundancy steering logic configured to receive one or more fuses and skip a damaged column marked by a corresponding fuse; and
      a bit write controller configured to receive one or more bit write and provide bit write control according to the one or more bit write received,
   wherein the column access control circuit incorporates redundancy steering control and bit write control into the column write enable output.

9. The memory chip of claim 8, wherein the bit write control is incorporated into redundancy steering control through the redundancy steering logic and the bit write controller.

10. The memory chip of claim 8, wherein the one or more fuses implement redundancy steering control through the redundancy steering logic and the redundancy steering logic incorporates bit write capability into the redundancy steering through the bit write controller.

11. The memory chip of claim 8, wherein the column write enable driver acts as a column interleave write enable selector and a bit write suppressor.

12. The memory chip of claim 8, wherein each of the column write enable drivers comprises:
   a first AND gate having a first input terminal, a second input terminal electrically coupled to a first column interleave write enable, and an output terminal configured to provide an output of the first AND gate;
   a second AND gate having a first input terminal, a second input terminal electrically coupled to a second column interleave write enable, and an output terminal configured to provide an output of the second AND gate; and
   an OR gate having a first input terminal electrically coupled to the output terminal of the first AND gate, a second input terminal electrically coupled to the output terminal of the second AND gate, and an output terminal configured to provide a column write enable output of the column write enable driver.

13. The memory chip of claim 12, wherein each of the redundancy steering logic comprises:
   an inverter having an input terminal electrically coupled to a fuse of a column which is two columns before a current column, and an output;
   a first NOR gate having a first input terminal, a second input terminal electrically coupled to the output terminal of the inverter, and an output terminal configured to provide a first output to the first input terminal of the first AND gate of the column write enable driver; and
   a second NOR gate having a first input terminal, a second input terminal electrically coupled to a fuse of the current column, and an output terminal configured to provide a second output to the first input terminal of the second AND gate of the column write enable driver.

14. The memory chip of claim 13, wherein each of the bit write controller comprises:
- an inverter having an input terminal electrically coupled to a fuse for a column which is one column before the current column, and an output terminal;
- a first AND gate having a first input terminal electrically coupled to a first bit write, a second input terminal electrically coupled to the fuse of the column which is one column before the current column and the input terminal of the inverter, and an output terminal;
- a second AND gate having a first input terminal electrically coupled to a second bit write, a second input terminal electrically coupled to the output terminal of the inverter, and an output terminal; and
- a NOR gate having a first input terminal electrically coupled to the output terminal of the first AND gate, a second input terminal electrically coupled to the output terminal of the second AND gate, and an output terminal electrically coupled to the first input terminal of the first NOR gate of the redundancy steering logic and the first input terminal of the second NOR gate of the redundancy steering logic.

15. A method for implementing column write enable with redundancy steering and bit write on a chip, comprising:
- receiving, at the chip wherein the chip comprises a plurality of memory columns, and each of the plurality of memory columns comprises a column access control circuit, a series of column interleave write enable at a plurality of column write enable drivers of the column access control circuits, a set of redundancy status from one or more fuses at a plurality of redundancy steering logics of the column access control circuits, and a series of bit write at a plurality of bit write controllers of the column access control circuits;
- processing the series of bit write received at each of the plurality of bit write controllers to implement a bit write control for each of the plurality of memory columns;
- incorporating the bit write control with redundancy steering control through each of the plurality of redundancy steering logics and each of the plurality of bit write controllers to generate redundancy steering control having bit write capability for each of the plurality of memory columns;
- processing the redundancy steering control having bit write capability generated and the series of column interleave write enable received at each of the plurality of column write enable drivers to incorporate the bit write control and the redundancy steering control with column write enable control for each of the plurality of memory columns; and
- generating column write enable outputs through each of the plurality of column write enable drivers for each of the plurality of memory columns, wherein the column write enable outputs incorporate a column write enable control, a redundancy steering control and a bit write control.

16. The method of claim 15, wherein each of the column access control circuit comprising:
- the column write enable driver having an output to produce column write enable output, wherein the column write enable driver is configured to receive one or more column interleave write enable and enable column write according to the column interleave write enable received;
- the redundancy steering logic configured to receive one or more fuses and skip a damaged column indicated by a corresponding fuse; and
- the bit write controller configured to receive one or more bit write and provide bit write control according to the one or more bit write received.

17. The method of claim 16, wherein the column write enable driver acts as a column interleave write enable selector and a bit write suppressor.

18. The method of claim 16, wherein the column write enable driver comprises:
- a first AND gate having a first input terminal, a second input terminal electrically coupled to a first column interleave write enable, and an output terminal configured to provide an output of the first AND gate;
- a second AND gate having a first input terminal, a second input terminal electrically coupled to a second column interleave write enable, and an output terminal configured to provide an output of the second AND gate; and
- an OR gate having a first input terminal electrically coupled to the output terminal of the first AND gate, a second input terminal electrically coupled to the output terminal of the second AND gate, and an output terminal configured to provide a column write enable output of the column write enable driver.

19. The method of claim 18, wherein the redundancy steering logic comprises:
- an inverter having an input terminal electrically coupled to a fuse of a column which is two columns before a current column, and an output;
- a first NOR gate having a first input terminal, a second input terminal electrically coupled to the output terminal of the inverter, and an output terminal configured to provide a first output to the first input terminal of the first AND gate of the column write enable driver; and
- a second NOR gate having a first input terminal, a second input terminal electrically coupled to a fuse of the current column, and an output terminal configured to provide a second output to the first input terminal of the second AND gate of the column write enable driver.

20. The method of claim 19, wherein the bit write controller comprises:
- an inverter having an input terminal electrically coupled to a fuse for a column which is one column before the current column, and an output terminal;
- a first AND gate having a first input terminal electrically coupled to a first bit write, a second input terminal electrically coupled to the fuse of the column which is one column before the current column and the input terminal of the inverter, and an output terminal;
- a second AND gate having a first input terminal electrically coupled to a second bit write, a second input terminal electrically coupled to the output terminal of the inverter, and an output terminal; and
- a NOR gate having a first input terminal electrically coupled to the output terminal of the first AND gate, a second input terminal electrically coupled to the output terminal of the second AND gate, and an output terminal electrically coupled to the first input terminal of the first NOR gate of the redundancy steering logic and the first input terminal of the second NOR gate of the redundancy steering logic.

* * * * *